United States Patent [19]

Gamo et al.

[11] 3,860,947

[45] Jan. 14, 1975

[54] THYRISTOR WITH GOLD DOPING PROFILE

[76] Inventors: Hiroshi Gamo; Akira Kawakami, both of Itami, Japan

[22] Filed: Nov. 2, 1973

[21] Appl. No.: 412,271

Related U.S. Application Data

[63] Continuation of Ser. No. 125,243, March 17, 1971, abandoned.

[30] Foreign Application Priority Data

Mar. 19, 1970 Japan ............................... 45-23342

[52] U.S. Cl. ........................ 357/38, 357/64, 357/90, 148/190

[51] Int. Cl. ........................................... H01l 11/10

[58] Field of Search ............ 317/235 AB, 235 AN, 317/235 AQ

[56] References Cited

UNITED STATES PATENTS

| | | | |
|---|---|---|---|
| 3,320,103 | 5/1967 | Drake et al. | 317/235 AQ |
| 3,342,651 | 9/1967 | Raithel | 317/235 AB |
| 3,419,764 | 12/1968 | Kasugai et al. | 317/235 AQ |
| 3,440,113 | 4/1969 | Wolley | 317/235 AB |
| 3,445,736 | 5/1969 | Navon et al. | 317/235 AQ |
| 3,461,359 | 8/1969 | Raithel | 317/235 AB |
| 3,486,950 | 12/1969 | Lesk | 317/235 AQ |
| 3,487,276 | 12/1969 | Wolley | 317/235 AB |
| 3,514,675 | 5/1970 | Purdom | 317/235 AB |
| 3,579,815 | 5/1971 | Gentry | 317/235 AB |
| 3,640,783 | 2/1972 | Bailey | 317/235 AQ |
| 3,645,808 | 2/1972 | Kamiyama et al. | 317/235 AQ |
| 3,662,232 | 5/1972 | Stahr | 317/235 AB |
| 3,728,592 | 4/1973 | Joshi et al. | 317/235 AN |

*Primary Examiner*—Rudolph V. Rolinec
*Assistant Examiner*—William D. Larkins
*Attorney, Agent, or Firm*—Robert E. Burns; Emmanuel J. Lobato; Bruce L. Adams

[57] ABSTRACT

The disclosed semiconductor switching device is comprised of a PNPN or NPNP structure having four semiconductor regions, one region of the two central regions having a higher specific resistivity and sandwiched between a centrally positioned junction and one of end junctions of three PN junctions formed between the four regions. The central region of higher specific resistivity has impurities for controlling the lifetime of carriers, and its concentration distribution being such that the impurity concentration of that portion adjacent to the central junction is higher than that of the portion adjacent to the abovementioned end junction.

12 Claims, 6 Drawing Figures

THYRISTOR WITH GOLD DOPING PROFILE

This is a continuation of application Ser. No. 125,243, filed Mar. 17, 1971, now abandoned.

BACKGROUND OF THE INVENTION

1. Field of the invention

This invention relates to a semiconductor switching device and, in particular, to a semiconductor switching device having a wafer including a PNPN structure or an NPNP structure wherein four semiconductor regions are disposed in such a relationship that each region is of a different conductivity type from the adjacent ones.

2. Description of the Prior Art

Semiconductor switching devices having a wafer including such a kind of PNPN structure or NPNP structure are called "thyristors" and widely used as switching elements in electric circuits. When a thyristor is applied to inverter-chopper device as a switching device, the thyristor is required to have a short turn-off time.

The turn-off time of the thyristor refers to the time required to turn-off the thyristor. It is known that, in the case of a thyristor utilizing silicon as a semiconductor material, the turn-off time depends upon the lifetime of the carriers stored in the silicon. Therefore, to shorten the turn-off time, it is required to shorten the lifetime of the carriers.

It is also known that the lifetime of the carriers can be shortened by doping with heavy metal atoms such as gold atoms, and the more the heavy metal atoms are doped the shorter the lifetime of the carriers becomes. This is because the heavy metal atoms serve as recombination centers for the carriers injected in the silicon material. Therefore, by doping the with heavy metal atoms to the semiconductor material for a thyristor, the turn-off time of the thyristor can be shortened. However, the heavy metal atoms in the semiconductor material, on the other hand, the forward voltage drop during the ON state which is another important property of the thyristor and also increases leakage current during the OFF state. The increase in forward voltage drop during the ON state results in increase in power loss of the device and the increase in leakage current results in decrease in blocking voltage during the OFF state, both reducing the commercial value of the device.

The degree of increase in forward voltage drop during the ON state and the degree of decrease in blocking voltage sharply increase when a large amount of heavy metal atoms is doped in the semiconductor material. This trend is especially conspicuous in the case of the thyristor produced from a thick silicon water with high resistivity. In such a case, it is confirmed that only a small amount of heavy metal atoms greatly increases the forward voltage drop and greatly decreases the blocking voltage.

In the conventional thyristor containing heavy metal atoms, a central semiconductor region having the higher resistivity of the two central semiconductor regions is substantially equal in concentration of the heavy metal atoms at those portions adjacent to PN junctions on both sides of that central region. With such a concentration distribution of heavy metal atoms, it has been difficult to satisfy all three requirements to decrease the forward voltage drop during the ON state, to increase the blocking voltage, and to shorten the turn-off time of the thyristor.

Accordingly, an object of the invention is to provide an improved and new semiconductor switching device, wherein the above three requirements - to decrease the forward voltage drop during the ON state, to increase the blocking voltage, and to shorten the turn-off time - are more effectively satisfied.

SUMMARY OF THE INVENTION

According to the present invention, there is provided a semiconductor switching device comprising a semiconductor wafer including four semiconductor regions disposed in such a relationship that each of said four semiconductor regions exhibits a different conductivity type from those of adjacent ones, one central region higher in resistivity of two central regions of said four semiconductor regions being sandwiched between a first junction centrally positioned of three PN junctions formed between said four semicondcutor regions and a second junction positioned on one of the ends of said three PN junctions, and said semiconductor wafer including therein impurities for controlling the lifetime of carriers and the concentration of said impurities involved in said central region of higher resistivity being high at that portion adjacent to said first junction relative to that at that portion adjacent to said second junction.

BRIEF DESCRIPTION OF THE DRAWING

Throughout several Figures the same reference characters designate the identical or corresponding components.

DESCRIPTION OF THE PREFERRED EMBODIMENT

Figure 1A:
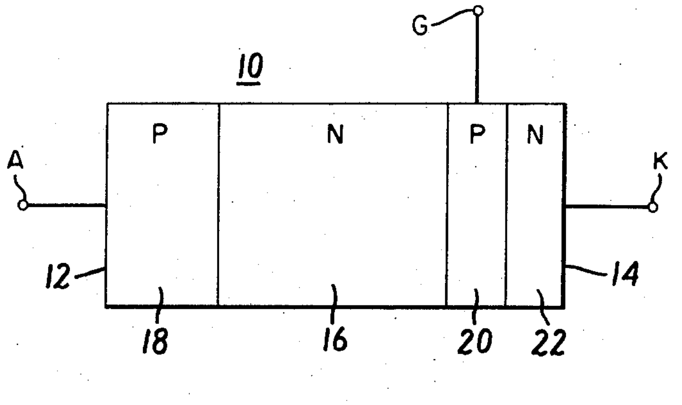
FIG. 1*a* is a schematic diagram of the semiconductor switching device constructed in accordance with the present invention.

Referring now to the drawing and in particular to FIG. 1*a*, wherein a semiconductor switching device of a PNPN structure is schematically illustrated, it is seen that a wafer made of a semiconductor material such as silicon is generally designated by the reference numeral 10. The semiconductor wafer 10 has two substantially parallel surfaces 12 and 14. The wafer 10 is prepared from a silicon monocrystal material of N-conductivity type as a starting material, which remains without any change in the completed wafer 10 as a central N-type layer 16. The resistivity of the central N-type layer 16 is in general not less than several Ω-cm and the thickness thereof is selected to be from several ten to several hundred microns as measured in the direction normal to the surfaces 12 and 14. At one side of the central N-type layer 16 there is provided an outer or end P-type layer 18 forming therebetween a PN junction $J_1$, and at the other side of the central N-type layer 16 there is provided a central P-type layer 20 also forming therebetween a PN junction $J_2$. These outer and central P-type layers 18 and 20 are formed by diffusing P-type impurity from the substantially parallel two surfaces 12 and 14 of the starting material. The central P-type layer 20 exhibits a resistivity of not more than 0.1 Ω-cm and has a thickness of about 20–50 microns as measured in the direction normal to the surfaces of the wafer 10. It is to be noted that the central N-type layer 16 has a higher resistivity and a greater thickness as compared with the central P-type layer 20.

It is also seen that an outer or end N-type layer 22 is formed adjacent to that surface of the central P-type layer 20 remote from the central N-type layer 16. The outer N-type layer 22 forms a PN junction $J_3$ between the same and the central P-type layer 20. This outer N-type layer 22 is formed, for example, by alloying into the central P-type layer 20 a metal containing the N-type impurities which is placed on the surface of the central P-type layer 20. The resistivity of both the outer P-type layer 18 and the outer N-type layer 22 are sufficiently lower than those of the central N-type layer 16 and the central P-type layer 20.

The semiconductor device also comprises an anode terminal A connected in ohmic contact relationship to the outer P-type layer 18, a cathode terminal K connected in ohmic contact relationship to the outer N-type layer 22, and a gate terminal G connected also in ohmic contact relationship to the central P-type layer 20.

It is easily understood that, for a wafer of NPNP structure, the respective layers 16, 18, 20 and 22 should be of opposite conductivity type to those above described.

Figure 1B:
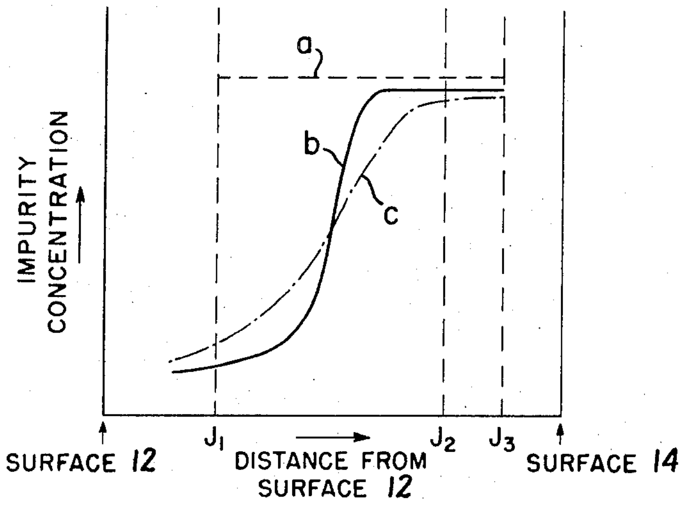
FIG. 1*b* is a graph showing the concentration distribution of the impurity doped in the device illustrated in FIG. 1*a* for controlling the lifetime of the carriers.

FIG. 1*b* shows the impurity concentration distribution of the semiconductor wafer 10 illustrated in FIG. 1*a*. The axis of abscissa represents the distance from the surface 12 of the semiconductor wafer 10 and the axis of ordinate represents the concentration of the impurities of heavy metal atoms such as gold atoms. The curve *a* of the FIGURE represents the concentration distribution of heavy metal atoms in a conventional thyristor, and curves *b* and *c* represent the concentration distributions of the heavy metal atoms in thyristors constructed in accordance with present teachings of the invention. Comparing the concentration distribution curves of the heavy metal atoms of the wafers of the present invention with that of the conventional device, it is easily understood that the impurity concentration of the conventional wafer at that portion adjacent to the central junction $J_2$ is substantially equal to that at that portion adjacent to the outer junction $J_1$, whereas the impurity concentrations of the wafers of the present invention at that portion adjacent to the junction $J_1$ is much lower than that of the conventional semiconductor wafer.

The concentration distributions of the heavy metal atoms as above described and shown by the curves *b* and *c* have been measured by the inventors through the spreading resistance measurement of resistivity of silicon material after the diffusion of gold utilizing the property of the silicon material of high resistivity that it varies in resistivity when gold is diffused therein.

According to the present invention, the semiconductor switching device is designed to have a lower heavy metal atom concentration at that portion of the central N-type layer 16 adjacent to the outer junction $J_1$ as illustrated by the curve *b* or *c* than that of that portion of the central N-type layer 16 adjacent to the central junction $J_2$. The improved thyristor with the heavy metal atom concentration distribution thus arranged can have a much smaller forward voltage drop in the ON state then the conventional thyristor for the same turn-off time. On the other hand, the same forward voltage drop as the conventional thyristor, the thyristor of the present invention can have a much shorter turn-off time than the conventional thyristor.

The reason for this will now be described in detail.

It is known that the turn-off time $t\delta$ of a thyristor can approximately be expressed by the following equation, which is disclosed, for example, as the equation (2.142) on page 112 of a literature entitled "Semiconductor Controlled Rectifiers" published in 1964 by Prentice-Hall, Inc., Englewood Cliffs, N.J.

$$t\delta = \tau_p \times \ln I_T/I_H \qquad (I)$$

where, $\tau_p$ is the lifetime of carriers in the central N-type layer 16, $I_T$ forward current in the ON state of the thyristor, and $I_H$ is a holding current. Necessary to hold the ON state. It is to be noted that the turn-off time $t\delta$ of the thyristor can be considered to be proportional mainly to the lifetime $\tau_p$ of the carriers in the central N-type layer 16 because the value of the term $\ln I_T/I_H$ does not depend upon the lifetime of the carriers so much.

To turn-off a thyristor in practical application, it is common to apply a reverse voltage so that the cathode electrode K becomes positive with respect to the anode electrode A, causing almost all the carriers which are accumulated in the central N-type layer 16 during the ON state to sweep out as a reverse current, and since the reverse voltage is applied to the PN junction $J_1$ to expand a depletion layer mainly toward high resistivity side of the junction $J_1$, or into the central N-type layer 16, almost all of the carriers in the vicinity of the junction $J_1$ vanish within a short period of time through the sweep out process. However, the carriers in the vicinity of the junction $J_2$ do not vanish immediately. These carriers in the vicinity of the junction $J_2$ are considered to vanish only through recombination process. Accordingly, the lifetime $\tau_p$ of the carriers in the equation (I) can be deemed to be the lifetime of the carriers in that portion of the central N-type layer 16 adjacent to the central junction $J_2$. Also, the turn-off time of the thyristor can be considered to be determined mainly in accordance with the lifetime of the carriers involved in that portion of the central N-type layer 16 adjacent to the central junction $J_2$. In other words, it can be considered that the turn-off time $t\delta$ is determined by the concentration of the heavy metal atoms involved in that portion of the central N-type layer 16 adjacent to the central junction $J_2$.

On the other hand, it is known that the forward voltage drop $V_T$ under the conditions that the thyristor is in its ON state can approximately be expressed by the following equation, which is disclosed as the equation (22) on page 155 of an American magazine "Radio Engineering & Electron Physics", 1963, Vol. 8.

$$V_T = kT/q\,(\delta \times e^{W_n/2L} + \ln I_T/I_{SO}) + I_r \times R \qquad (II)$$

where, $I_T$ is forward current in the ON state of a thyristor, is resistance of an electrode to be in contact with the wafer 10 of the thyristor, is saturation current of the outer junction $J_1$, $\delta$ is a constant ranging from 1 to 1.8, $W_n$ is thickness of the central N-type layer 16 as measured in the direction normal to the surfaces 12 and 14, L is a diffusion length of holes in the central N-type layer 16, q is unit electric charge, k is Boltzmann's constant, and T is absolute temperature.

It is also known that the following relationships are held between the diffusion length L of holes in the central N-type layer 16 and the saturation current $I_{SO}$ of the junction $J_1$:

$$L \approx \sqrt{D_p \times \tau_p} \qquad \text{(III)}$$

$$I_{SO} \propto 1/L \propto \tau_p^{-\frac{1}{2}} \qquad \text{(IV)}$$

where, $D_p$ is diffusion coefficient.

As apparent from these equations (III) and (IV), each of the diffusion length L and the saturation current $I_{SO}$ is a function of the lifetime $\tau_p$ of the carriers in the central N-type layer 16. Therefore, the terms that concern the lifetime $\theta_p$ of the carriers in the central N type layer 16 are the terms $\delta \times e\ W_n/2L$ and $ln\ I_T/I_{SO}$.

The first term, i.e., the term $\delta \times e\ W_n/2L$, can be transformed, by using the equation (III), as follows:

$$\delta \times e^{\frac{W_n}{2L}} = \delta \times e^{\left[\frac{W_n}{\sqrt{D_p \times \tau_p}}\right]} \qquad \text{(V)}$$

In the equation (V), it is to be noted that the lifetime $\bar{\tau}_p$ of the carriers in the central N-type layer 16 is the mean value.

In a thyristor having the concentration distribution of heavy metal atoms as shown by the curve *a* in FIG. 1*b*, the lifetime $\tau_p$ of the carriers in the central N-type layer 16 has a substantially constant value irrespective of the distance from the surface of the wafer, and that value equals at every point the value of the lifetime of the carriers in that portion adjacent to the central junction $J_2$ necessary for obtaining a desired turn-off time.

On the contrary, in the thyristor of the invention which has the concentration distribution of heavy metal atoms as shown by the curve *b* or *c* of FIG. 1*b*, the concentration of heavy metal atoms at that portion of the central N-type layer 16 adjacent to the central junction $J_2$ is almost equal to that of the conventional semiconductor wafer, thereby to obtain substantially the same lifetime $\tau_p$ of the carriers in the vicinity of the central junction $J_2$, whereas the concentration of the heavy metal atoms is lowered in the vicinity of the junction $J_1$ which is away from the center junction $J_2$, thereby to obtain a long lifetime $\tau_p$ of the carriers in the vicinity of the junction $J_1$. This enables the mean value of the lifetime $\tau_p$ of the carriers within the central N-type layer 16 to be longer than the lifetime of the conventional device. As a result, the diffusion length L of the holes in the central N-type layer 16 becomes longer than that of the conventional device. Therefore, according to the present invention, the term of $\delta \times e\ W_n/2L$ can be reduced thereby to decrease the value of the forward voltage drop $V_T$. The decrease in the value of the term $\delta \times e\ W_n/2L$ provides a great effect which will be later described in conjunction with the embodiment of the invention.

Considering now the term of $ln\ I_T/I_{SO}$, it is apparent from the equation (IV), that the saturation current $I_{SO}$ of the junction $J_1$ decreases due to the increase in diffusion length L of the holes in the central N-type layer 16 as compared with that of the conventional design. Although the value of the term $I_T/I_{SO}$ increases because of decrease in saturation current $I_{SO}$, the amount of increase in the value of $lnI_T/I_{SO}$ which is a logarithmic value of $I_T/I_{SO}$ is sufficiently small and negligible in comparison with the amount of decrease in the value of the term of $\delta \times e\ W_n/2L$.

Thus, when the concentration of the heavy metal atoms of the central N-type layer 16 in the vicinity of the central junction $J_2$ is designed to have the same value as that of the conventional device, the forward voltage drop under the ON state can be reduced to be sufficiently small as compared with that of the conventional device. On the other hand, upon applying the concentration distribution of the heavy metal atoms according to the invention to a semiconductor wafer, if the mean value of the concentration of the heavy metal atoms throughout the entire central N-type layer 16 is selected to be the same value as that of the conventional thyristor, the forward voltage drop in the ON state is equal to that of the conventional device. The turn-off time of that device, however, can be shortened because the concentration of the heavy metal atoms of the central N-type layer 16 in the vicinity of the central junction $J_2$ becomes higher than that of the conventional device. This will be easily understood from the foregoing description.

According to the present invention there is provided an improved thyristor wherein the concentration of the heavy metal atoms of the central N-type layer 16 in the vicinity of the central junction $J_2$ which contributes to shortening the turn-off time is selected to be high relative to that in the vicinity of the junction $J_1$, thereby to decrease the turn-off time of the device and, at the same time, the concentration of the heavy metal atoms of the central N-type layer 16 in the vicinity of the end junction $J_1$ which does not contribute to shortening the turn-off time is selected to be low relative to that in the vicinity of the junction $J_2$, thereby to contemplate to maintain a longer mean lifetime of the carriers within the central N-type layer 16 to decrease the forward voltage drop under the ON state.

The invention will now be described in conjunction with FIG. 2, wherein an embodiment of the present invention is illustrated, along the manufacturing steps of the illustrated device in comparison with those of the conventional device.

Figure 2:
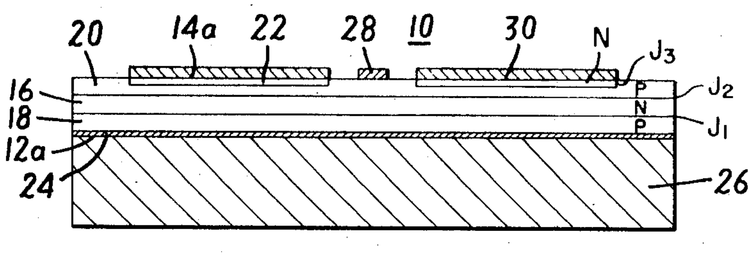
FIG. 2 is a sectional view of one embodiment of the semicondcutor switching device constructed in accordance with the present invention.

In both FIGS. 1*a* and 2, the same or identical components illustrated in FIG. 1*a* are designated by the common reference characters for easy understanding. It is seen that a circular discal semiconductor wafer 10 has two surfaces 12*a* and 14*a* parallel to each other. The wafer 10 is 24 (mm) in diameter and 330 microns in thickness prepared from a silicon monocrystal substrate having the N-conductivity type and a resistivity of 50Ω-cm. This wafer 10 is prepared as a starting material in a first step. In a second step, gallium is diffused as P-type impurity into the wafer 10 from both the surfaces 12*a* and 14*a* to form another P-type end layer 18 and a central P-type layer 20, thereby to form a PNP three-layer structure. The condition under which the diffusion of gallium is achieved are such as to provide a surface concentration of $5 \times 10^{17}$ atoms/cm$^3$ and a diffusion length of 75 microns.

According to the conventional manufacturing method, heavy metal atom diffusion such as gold diffusion has been applied directly to the PNP three-layer structure immediately after the second step. This diffusion has been achieved, according to the conventional method, by attaching gold on the entire surfaces 12*a* and 14*a* of the wafer 10 of the PNP three-layer structure and, thereafter, the wafer 10 is heated to an elevated temperature in the atmosphere of inactive gas such as dried nitrogen gas atmosphere thereby to diffuse the element gold into the wafer 10. To attach a metal on the surface of the wafer the vacuum evaporation technique or the like has been applied. The wafer 10 of the conventional thyristor prepared by the conventional method as has been described exhibits substantially constant concentration of gold within the central N-type layer 16 as seen from the curve *a* of FIG. 1*b*.

According to the method of the present invention, the surface 12*a* on the side of the outer P type layer 18 of the wafer 10 of the PNP three-layer structure prepared by the second step is entirely covered with a phosphorus doping layer which has a thickness of several microns. Although the formation of this phosphorus doping layer may also be achieved through various other methods, the diffusion method was used in the case of the embodiment illustrated in FIG. 2. This diffusion was achieved by first removing a film of silicon oxide produced on the surfaces 12*a* and 14*a* during the diffusion of gallium. Then the wafer 10 is heated to an elevated temperature in an atmosphere of a vapor of phosphorus oxychloride or phosphorus pentoxide. The phosphorus doping layer was formed to have a surface impurity concentration of more than $2-10 \times 10^{19}$ atoms/cm$^3$. To obtain such a surface impurity concentration, the wafer 10 is required to be heated at a temperature of more than 1,000°C for 30 minutes or more.

Thereafter, the oxidized silicon film of the silicon layer on the surface 14*a* is removed from the entire surface 14*a*, and a gold layer is deposited throughout the surface 14*a*. At the time of depositing the gold layer on the surface 14*a*, another gold layer may be deposited also on the entire surface of the phosphorus doping layer after the oxidized silicon film produced on the phosphorus doping layer surface has been removed therefrom. These depositions of gold layers can be achieved by vacuum evaporation or the like as in the case of the conventional device. The wafer 10 on which gold layer deposition has been cpmpleted is then heated at an elevated temperature in an atmosphere of an inactive gas such as a dried nitrogen gas atmosphere as in the conventional method, thereby to diffuse the gold atoms contained in the gold layer into the wafer 10. The wafer 10, after the gold diffusion has been completed is then subjected to treatments for removing the residual gold layer on the surface 14*a*, and the phosphorus doping layer on the surface 12*a*. Thus, a wafer of a PNP three-layer structure in which the gold diffusion has been completed is provided as a third step the manufacturing method.

Figure 3:
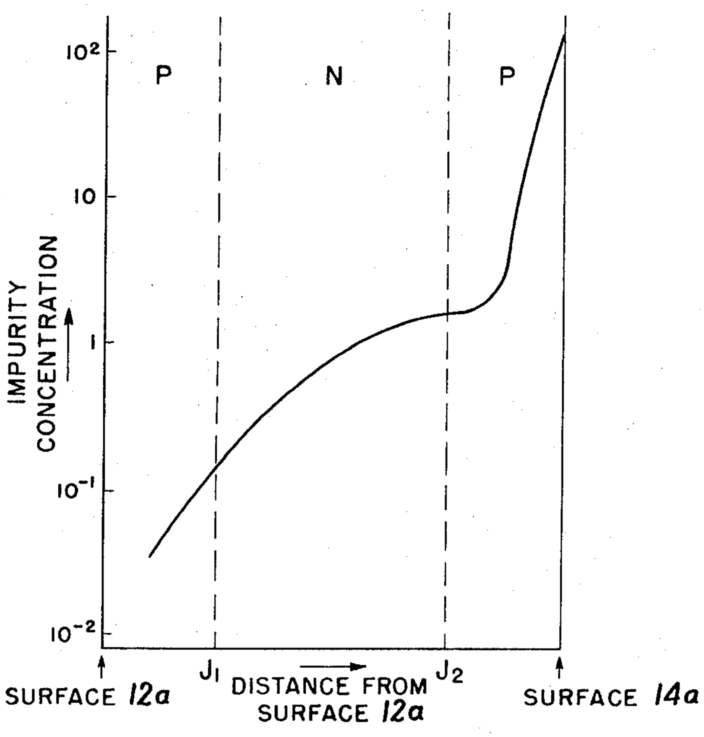
FIG. 3 is a graph showing the measured concentration distribution of the impurity doped into the semiconductor switching device of the invention for controlling the lifetime of the carriers.

FIG. 3 shows the concentration distribution of the gold atoms in the wafer 10 of the PNP three-layer structure after the gold diffusion has been completed. In the Figure, the axis of abscissa represents the distance from the surface 12*a* of the wafer 10 and the axis of ordinate represents the concentration of gold atoms. The concentration distribution of the gold atoms shown in FIG. 3 was confirmed by the inventors through the measurement of the variation in resistivity of silicon by the spreading resistance measurement and well-known methods of radio-activation analysis. As apparent from FIG. 3, the concentration of gold atoms in the central N-type layer 16 has its maximum value at that portion adjacent to the junction $J_2$ and decreases continuously toward the junction $J_1$ to exhibit a minimum value at that portion adjacent to the junction $J_1$. The maximum value of the concentration is greater by 2 to 5 times than the minimum value thereof. According to various experiments, the maximum value should have a value of more than 1.2 times the minimum value to obtain the previously described effects of the present invention. Preferably, the maximum value has a value of more than 1.5 times of the minimum value.

The concentration distribution of gold as shown in FIG. 3 is realized by the presence of the phosphorus doping layer deposited prior to the diffusion of gold. The phosphorus doping layer having an impurity concentration of more than $2-10 \times 10^{19}$ atoms/cm$^3$ serves to lower the concentration of gold atoms on that side where the layer is applied or on that side of the surface 12*a* relative to the concentration of gold atoms on that side where the layer is not applied or on that side of the surface 14*a*.

On the surface 12*a* of the wafer 10 of the PNP three-layer structure after the gold diffusion has been completed, there is disposed a molybdenum plate 26 sandwiching therebetween an aluminum foil 24, whereas the surface 14*a* is provided at its central portion with a gold-boron foil 28. In addition, a gold-antimon foil 30 is disposed on the outer periphery thereof. These foils 24, 28 and 30 and the molybdenum plate 26 are brought into pressure contact as they are placed as described above to be heated and alloyed. By this treatment of heating and alloying the molybdenum plate 26 is attached to the surface 12*a* defined by the outer P-type layer 18 of the wafer 10 through the aluminum foil 24 to construct an ohmic contact connected to the anode electrode A. The gold-antimony foil 30 is attached to the center P-type layer 20 while alloying N-type impurities (antimony) to form the annular outer N-type layer 22 in one side of the surface 14*a* of the central P-type layer 20 and, at the same time, to construct an ohmic contact connected to the cathode K on the outer N-type layer 22. This outer N-type layer 22 is formed as though it is inserted from the surface 14*a* into the central P-type layer 20 and the surface 14*a* becomes a common surface of these layers 20 and 22. The gold-boron foil 28 is attached to the central portion of the central P type layer 20 on that side of the surface 14 by alloying the P-type impurities and boron into the central P-type layer 20 to form an ohmic contact on the central P-type layer 20 connected to the gate electrode G.

After these heating and alloying treatments have been completed, the wafer 10 is treated by chemical etching to expose the clearn junctions $J_1$ and $J_2$. Thereafter, an insulating material such as silicone varnish or silicone rubber is applied to the periphery of the wafer 10 although it is not illustrated. This insulating material is solidified to provide a protection for the junctions $J_1$ and $J_2$. Although not illustrated the completed wafer 10 is placed in an unillustrated outer shell to form a complete semiconductor switching device.

It is to be noted that although the outer N-type layer 22 has been described as being formed by alloying the gold-antimony foil 30 into the central P-type layer 20, this layer may also be formed by the well-known diffusion technique of the N-type impurities from the surface 14 into the central P-type layer 20. In this case, the phosphorus doping and the gold diffusion process already described are carried out after N-type layer 22 has been formed.

Figure 4:
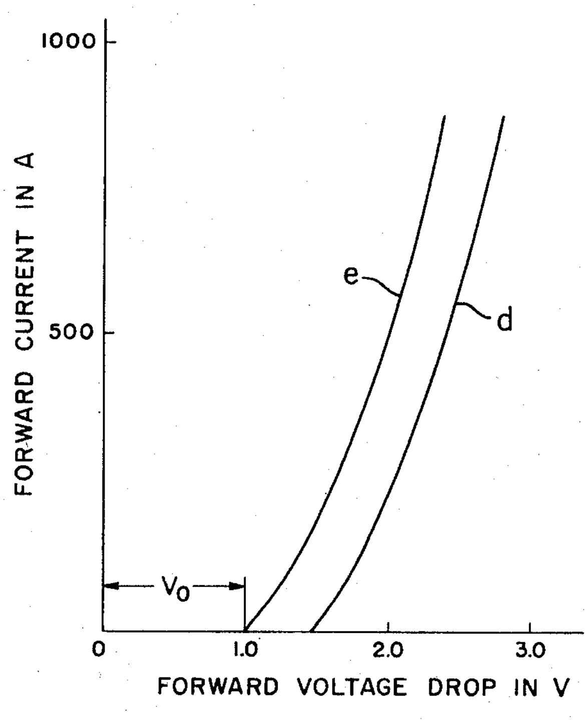
FIGS. 4 and 5 are graphs showing characteristics of the semiconductor switching device of the invention in comparison with the conventional device.

The thyristor constructed in accordance with the present invention and the conventional thyristor will now be compared in terms of the forward voltage drop in the ON state, the turn-off time and the characteristic of the blocking voltage. The comparison will be first made in terms of the properties under the condition that the temperature $T_j$ of the junction is at 115°C for both the thyristor of the invention and a conventional thyristor designed to have substantially the same turn-off time of from 18 to 20 microseconds. The conventional thyristor which exhibits the turn-off time of that order has a forward voltage drop of from 2.2 to 2.4 volts when a current of 500 A flows. On the other hand, it was confirmed that the thyristor constructed in accordance with the present invention provides a forward voltage drop of from 1.8 to 2.0 volts under the same conditions, exhibiting a great effect. FIG. 4 shows the voltage-to-current characteristics of both the present and the conventional thyristors. The axis of abscissa of the graph represents the forward voltage drop in the ON state of the thyristor and the axis of ordinate represents the magnitude of the current flowing therethrough. The curve *d* shows the voltage-to-current characteristic of the conventional thyristor whereas the curve *e* shows that of the thyristor of the present invention. From these curves it is seen that the forward voltage drop of the thyristor of the invention is lower than that of the conventional thyristor with equal current flowing therethrough. It is also seen that, according to present invention, the voltage drop $V_0$ when the current begins to flow is lower. This decrease in forward voltage drop shows that the value of the term $\delta \times e W_n/2L$ of the equation (II) has been decreased.

Figure 5:
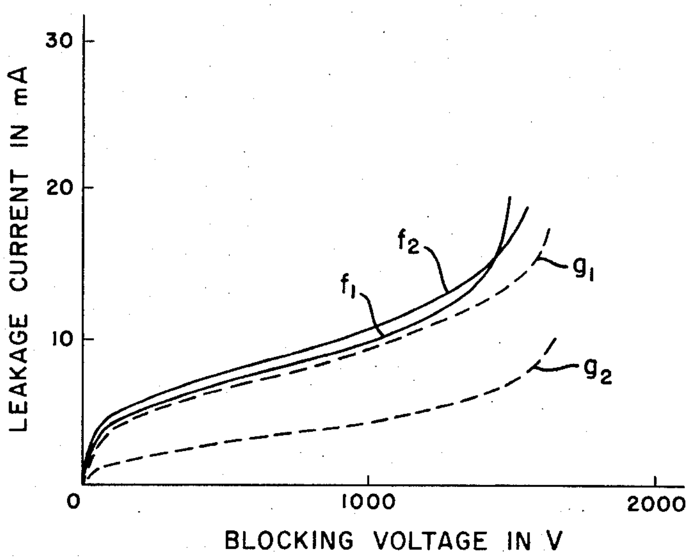

FIG. 5 shows the leakage current-to-voltage characteristics of both the thyristors of the present invention and the conventional design with a temperature $T_j$ at the junction of 115°C. The curve $f_1$ shows the relationship between the voltage and the leakage current of the conventional thyristor when it is in the OFF state due to the application of a forward voltage or a voltage of such polarity is such that the anode electrode A becomes positive with respect to the cathode electrode K, and curve $f_2$ shows the relationship between the voltage and the leakage current of the thyristor of the present invention when it is in the OFF state due to the application of a forward voltage to the thyristor. Curves $g_1$ and $g_2$ show the relationship between the voltage and the leakage current of thyristors which are in the OFF state due to the application of a reverse voltage or a voltage of such polarity that the cathode K becomes positive with respect to the anode electrode A. The curves $g_1$ and $g_2$ show the characteristics of the thyristors of the conventional design and of the present invention respectively. It is apparent from these curves that, with the thyristor of the present invention, the leakage current upon application of a reverse voltage is remarkably reduced, resulting in an increase of the blocking voltage for the reverse voltage.

The fact that the leakage current upon the application of the reverse voltage is greatly reduced in comparison with that of the application of the forward voltage tells that the concentration of gold atoms of the central N-type layer 16 in the vicinity of the end junction $J_1$ is sufficiently low as compared with the concentration of gold atoms in the vicinity of the central junction $J_2$.

When each of the thyristors of the conventional design and of the present invention is arranged to have a forward voltage drop of about 2.4 volts when a current of 500 A flows in the ON state, the turn-off time of the thyristor of the present invention can be shortened to as low as from 10 to 15 microseconds, while the conventional thyristor exhibits a turn-off time of from 18 to 20 microseconds.

Although the invention has been described in terms of an embodiment wherein gold is diffused to provide the heavy metal atoms for controlling the lifetime of the carriers, another element which behaves similarly to gold such as iron or copper can also be used as the heavy metal. When iron or copper is used its concentration distribution can also be controlled owing to the presence of the phosphorus doping layer which has the concentration distribution as heretofore described.

What we claim is:

1. A semiconductor switching device comprising a semiconductor wafer including four semiconductor regions disposed in such a relationship that each of said four semiconductor regions exhibits a different conductivity type from those of adjacent ones, wherein one central region is composed of a material having a higher resistivity than the other central region and both having therebetween a first junction centrally positioned of three PN junctions formed between said four semiconductor regions and a second junction positioned on one of the ends of said three PN junctions, and wherein said semiconductor wafer includes therein impurities for controlling the lifetime of carriers injected therein during use of the device, and wherein the impurity concentration of the portion of said central region adjacent to said first junction has a value greater than 1.2 times that of the impurity concentration of the portion of the central region adjacent to said second junction.

2. A semiconductor switching device as claimed in claim 1, wherein said semiconductor wafer is composed mainly of silicon, and said impurities for controlling the lifetime of the carriers is composed of one element selected from the group consisting of gold, iron and copper.

3. A semiconductor switching device as claimed in claim 1, wherein said impurity concentration of said central region of higher resistivity has its maximum value at the portion adjacent to said first junction and its minimum value at the portion adjacent to said second junction.

4. A semiconductor switching device as claimed in claim 1, wherein said impurity concentration of the central region of higher resistivity has its maximum value at the portion adjacent to said first junction and decreases continuously toward said second junction to exhibit its minimum value at the portion adjacent to said second junction.

5. A semiconductor switching device comprising a semiconductor wafer having a first and a second end surfaces substantially parallel to each other and including four semiconductor regions disposed in such a relationship that each of said four semiconductor regions exhibits a different conductivity type from that of adjacent ones, a first end region of said four semiconductor regions defining said first end surface, a second end region thereof inserted into a first central region adjacent to the same to define the second end surface with said first central region, and a second central region disposed between said first end region and said first central region, a central PN junction being formed between said first and said second central regions, a first end PN junction formed between said first central region and said second end region, and a second end PN junction formed between said second central region and said first end region, and said wafer including therein impurities for controlling the lifetime of carriers injected therein during use of the device, and wherein the concentration of said impurities in the portion of said second central region adjacent to said central PN junction has a value greater than 1.2 times the concentration of said impurities in the portion of said second central region adjacent to said end PN junction.

6. A semiconductor switching device as claimed in claim 5, comprising a first electrode disposed on said first end surface in ohmic contact with said first end region, a second electrode disposed on said second end surface in ohmic contact with said second end region and a third electrode in ohmic contact with said first central region.

7. A semiconductor switching device as claimed in claim 6, wherein said second end region has an annular shape and the portion of said first central region encircled by said second end region is in ohmic contact with said third electrode.

8. A semiconductor switching device as claimed in claim 5, wherein said wafer is composed mainly of silicon, and said impurities for controlling the lifetime of the carriers is composed of one element selected from the group consisting of gold, iron and copper.

9. A semiconductor switching device as claimed in claim 5, wherein the concentration of said impurities in said second central region has its maximum value at the portion adjacent to said central PN junction and decreases continuously toward said second end PN junction to exhibit its minimum value at the portion adjacent to said second end PN junction.

10. In a semiconductor switching device having a turn-off time characteristic and a forward voltage drop characteristic: a semiconductor wafer having four opposed regions of alternate conductivity types collectively defining three p-n junctions wherein one of the regions defining the central junction is composed of material having a greater resistivity than that of the other region defining said central junction; and impurities in said wafer for controlling the lifetime of carriers injected therein during use of the semiconductor switching device and having an impurity concentration equal to a first value at said central junction thereby proportionally determining the turn-off time characteristic of the device and an impurity concentration equal to a second value at the outer junction partly defined by said one region thereby inversely determining the forward voltage drop characteristic of said device; and wherein said impurities are distributed in said wafer such that the impurity concentration increases from said outer junction to said central junction and said first value is greater than 1.2 times said second value thereby imparting to said device a faster turn-off time characteristic for an equivalent forward voltage drop characteristic with respect to a device with a substantially constant impurity concentration distribution and a lower forward voltage drop characteristic for an equivalent turn-off time characteristic with respect to a device with a substantially constant impurity concentration distribution.

11. A semiconductor switching device according to claim 10, wherein said semiconductor wafer is substantially composed of silicon.

12. A semiconductor switching device according to claim 10, wherein said impurities are composed of one element selected from a group consisting of gold, iron and copper.

* * * * *